United States Patent
Pizzato

(10) Patent No.: US 10,892,123 B2
(45) Date of Patent: Jan. 12, 2021

(54) SAFETY SWITCH WITH DETECTION OF THE DRIVING OF AN AUXILIARY UNLOCKING CONTROL

(71) Applicant: PIZZATO ELETTRICA S.R.L., Marostica (IT)

(72) Inventor: Marco Pizzato, Marostica (IT)

(73) Assignee: PIZZATO ELETTRICA S.R.L., Marostica (IT)

( * ) Notice: Subject to any disclaimer, the term of this patent is extended or adjusted under 35 U.S.C. 154(b) by 134 days.

(21) Appl. No.: 16/336,531

(22) PCT Filed: Sep. 26, 2017

(86) PCT No.: PCT/IB2017/055848
§ 371 (c)(1),
(2) Date: Mar. 26, 2019

(87) PCT Pub. No.: WO2018/055598
PCT Pub. Date: Mar. 29, 2018

(65) Prior Publication Data
US 2020/0127661 A1    Apr. 23, 2020

(30) Foreign Application Priority Data
Sep. 26, 2016 (IT) .......................... 102016000096402

(51) Int. Cl.
*H01H 27/00* (2006.01)
*H01H 50/32* (2006.01)
(Continued)

(52) U.S. Cl.
CPC ........ *H01H 27/002* (2013.01); *H01H 27/007* (2013.01); *H01H 50/32* (2013.01);
(Continued)

(58) Field of Classification Search
CPC .... H01H 27/002; H01H 27/007; H01H 50/32; H03K 17/9502; H03K 17/97; H03K 2017/9713; F16P 3/08
See application file for complete search history.

(56) References Cited

U.S. PATENT DOCUMENTS 3,049,208 A * 8/1962 Parkes ...................... F16P 3/08
                                                    192/135
3,892,933 A * 7/1975 Rocchitelli ............. D06F 37/42
                                                    337/77
(Continued)

FOREIGN PATENT DOCUMENTS

WO    WO-2015083143 A1 * 6/2015 ............. H01H 50/02

*Primary Examiner* — Mohamad A Musleh
(74) *Attorney, Agent, or Firm* — Mark M. Friedman

(57) ABSTRACT

A safety switch comprises a switching device (2) having a casing (4) housing switching means (5) connected to one or more circuits, an operating device (3) interacting with the switching means (5) for opening/closing the circuits, an unlocking mechanism (13) having an unlocking pin (14) translating with a maximum stroke from a locking position of the access to an unlocking position to operate the opening of the switching means (5), detection means (17) of the stroke of the unlocking pin (14) having a first detector (18) of the start of the stroke of the unlocking pin (14), an auxiliary unlocking control (25, 26) operatively connected to the unlocking mechanism (13) from a rest position to an operative position of unlocking of the access and promote the translation of the unlocking pin (14) The detection means (17) comprise an auxiliary detector (31) for detecting the actuation of the auxiliary unlocking control (25, 26).

10 Claims, 6 Drawing Sheets

(51) Int. Cl.
*H03K 17/95* (2006.01)
*H03K 17/97* (2006.01)
(52) U.S. Cl.
CPC ......... *H03K 17/9502* (2013.01); *H03K 17/97* (2013.01); *H03K 2017/9713* (2013.01)

(56) References Cited

U.S. PATENT DOCUMENTS

| | | | | |
|---|---|---|---|---|
| 5,861,786 A | * | 1/1999 | Laveau | H01H 27/007 335/132 |
| 2005/0109593 A1 | * | 5/2005 | Da Dalt | H01H 27/007 200/43.04 |
| 2008/0264766 A1 | * | 10/2008 | Hermann | H01H 27/007 200/43.11 |

* cited by examiner

SAFETY SWITCH WITH DETECTION OF THE DRIVING OF AN AUXILIARY UNLOCKING CONTROL

TECHNICAL FIELD

The present invention finds application in the field of electrical devices for industrial use and it particularly relates to a safety switch for controlling the access to a machine or industrial plant and is adapted to detect the driving of auxiliary unlocking controls, such as an emergency push-button or key selector.

STATE OF THE ART

As known, switches designed to guard the access of industrial machines or plants, such as security panels, barriers, and safety perimeters, comprise a switching device which can be anchored to the fixed part of the access and an operating device adapted to be anchored to the movable part.

In a known manner, the closure of the movable part causes the interaction between the switching device and the operating device, making it possible to start the machine or plant, unless there are conditions requiring the specific operation of an operator.

By contrast, the opening of the access, and the consequent moving away of the operating device from the switching device, results in the immediate stop of the machine or plant to allow it to be accessed in safe conditions.

The control of the switching means for opening and closing the power supply circuit of the machine or plant can be carried out either by means of a mechanical or electronic actuator.

The first type switches, described for example in EP2112674 in the name of the same Applicant, comprise a movable device having a key actuator adapted to be inserted into a slot of the fixed switching device to engage a driving mechanism of the switching means and cause the power supply circuit and any possible auxiliary circuits to open/close.

In the electronic operated switches, examples of which are reported in WO2015083143 and WO2015083144, always in the name of the same Applicant, the two devices are provided respectively with an antenna and a transmitter communicating with each other by sending an identification signal which allows a control unit housed in the switching device to discriminate the presence or absence of the operating device to provide for the closing or opening of the main power circuit accordingly.

Both the two types of switches require that the switching device houses thereinto an unlocking mechanism having a sliding pin designed to engage the switching means so that upon the descent stroke of the pin the sending of an opening command for the switching means occurs.

In particular, the unlocking mechanism is designed to allow the access to be open only when the switching means are open.

The more advanced switches also comprise a control unit adapted to detect the stroke of the unlocking pin to transmit to the switching means a suitable signal adapted to produce the opening of the contacts and the stop of the machine or plant.

In particular, optically-sensing detectors are provided, which detect the descent movement of the slider and produce the immediate stop of the system.

A first drawback of these switches is that the detection means are designed to detect only the beginning of the stroke of the pin, causing the machine or plant shutdown as soon as it is detected.

By contrast, no control is made on the end-stroke of the pin and therefore on the correct operation of the pin.

This operation mode, in addition to not being able to verify that the unlocking pin has properly completed its stroke, does not discriminate between a full stroke of the pin as a result of a regular opening of the access and a partial stroke, due for example to vibration or high intensity stress transmitted to the switch.

WO2015028106 discloses a safety switch having a key actuator with two optical barrier proximity sensors adapted to detect two distinct positions of the pin as a result of its stroke produced by the actuator.

However, the two sensors are designed to generate signals relating to the presence of the actuator within the sot of the switching device and are not designed to check the start and end of the pin stroke during the unlocking step.

In fact, the switch is designed so that in the extraction step of the actuator for the opening of the access, the upper optical barrier is already interrupted and the unlocking movement of the pin only produces interaction with the lower light barrier to report the key actuator extraction. Consequently, this switch is not suitable for detecting minimum stroke of the unlocking pin that could be caused by external shocks or vibrations.

A further drawback of the known solutions is related to the power supply of the electromagnet normally designed to produce the pin stroke at the opening of the access.

As matter of fact, the known solutions provide that the electromagnet is constantly powered in order to keep the pin in the end stroke position.

However, in order to ensure that the pin stays in the end stroke position, the control unit is designed to send at regular time intervals energy pulses with higher intensity, resulting in increased power consumption.

Last but not least drawback due to the presence of a single detector of the stroke of the unlocking pin is found in switches equipped with an emergency button, such as an emergency mushroom or similar controls.

In fact, in these switches it is not possible to discriminate whether the machine or plant shutdown is due to the opening of the access, resulting in downward stroke of the pin, or to the driving of the emergency button.

WO2016/058718 describes a device for closing an access provided with an emergency button wherein there is a locking pin adapted to move from a closing position to an open position.

The device is equipped with two detectors designed to discriminate between an access unlocking condition produced by a normal operation from an unlock condition produced by the emergency button drive.

However, this device is not applicable to switches with a key or electronic actuator in which the unlocking of the pin causes the machine or plant to shut down.

SCOPE OF THE INVENTION

The object of the present invention is to overcome the above drawbacks by providing a safety switch with drive detection of an auxiliary unlocking control that exhibits high efficiency and relative economics features.

A particular object is to provide a safety switch which in addition to allowing to detect the driving of the auxiliary unlocking control may also discriminate between a stop of the machine or plant due to the opening of access from a stop due to the drive of this control.

Yet another object is to provide a safety switch which also allows to detect both the start of the unlocking mechanism stroke and the end-stroke thereof for the full control of the causes that have caused the machine or plant to stop.

Still another object is to provide a safety switch that allows to check the correct operation of the unlocking mechanism.

A further object is to provide a safety switch with a drive detection of an auxiliary unlocking control that allow to have energy saving.

Such objects, as well as others that will become more apparent hereinafter, are achieved by a safety switch with detection of the driving of the unlocking control which, according to claim 1, comprises a switching device adapted to be associated to a fixed part of an access to be supervised and having a casing defining a longitudinal axis and housing switching means adapted to be operatively connected to one or more control and/or service circuits for the control thereof, an operating device associated to a movable part of the access to interact with said switching means at the time of opening/closing of the access for opening/closing one or more of said circuits, an unlocking mechanism housed in said casing and having an unlocking pin adapted to translate longitudinally with a maximum predetermined stroke from a locking position of the access to an unlocking position to operate the opening of said switching means, means for detection of the stroke of said unlocking pin having at least one first detector adapted to detect the start of the stroke of said unlocking pin, at least one auxiliary unlocking control operatively connected to said unlocking mechanism and adapted to move from a rest position to an operative position of unlocking of the access and promote the translation of said unlocking pin even with said actuator device inserted.

The detection means comprise at least one auxiliary detector adapted to detect the driving of said at least one auxiliary unlocking control.

In this way, the switch may indicate the auxiliary control driving and thus it will be possible to discriminate between a machine stop determined by the drive of the control from a machine stop caused by the access opening.

Preferably, the detection means may comprise at least one first detector for detecting the start of the unlocking pin stroke and a second detector for detecting the end of the stroke.

In this way it will possible to be sure that the unlocking pin has completed at least for the most part its stroke, in order to be sure of the correct operation of the switch and be able to intervene appropriately if the unlocking pin does not have performed a full stroke.

At the same time, it will be possible to discriminate between the movements of the unlocking pin due to strong vibrations or stresses imparted to the switch and which have caused a limited stroke thereof from movements caused from the opening of the access or operation of an emergency button or other unlocking control with consequent complete stroke of the pin. Suitably, the detection means may be of an optical detector type, such as photocouplers, optical barriers or the like, which detect the passage of the slider and of the structure of the emergency button or may still be magnetic, inductive, capacitive or similar detectors.

This will allow to use a technology that is already widely used in this type of switches and therefore reliable, economical and does not require the redesign of electronic management components.

Advantageous embodiments of the invention are obtained according to the dependent claims.

BRIEF DISCLOSURE OF THE DRAWINGS

Further features and advantages of the invention will become more apparent in the light of the detailed description of a preferred but not exclusive embodiment of a safety switch according to the invention illustrated by way of non-limiting example with the aid of the attached drawing tables, wherein.

BEST MODE OF CARRYING OUT THE INVENTION

With reference to the accompanying figures, a preferred but not exclusive configuration of a safety switch for controlling access to industrial machines or plants is shown, which is adapted, in a preferred but not exclusive manner, to be applied to a barrier or movable panel adapted to prevent unsafe access to a machine or industrial plant during action.

In a known manner, the switch is designed to be applied to the protection at an access thereof to interrupt, in an immediate manner or with time-delay, the operation of the machine or plant in the event of a request for opening such access.

The opening of the access can be of any type, either swinging or sliding, and still with right or left opening, without any particular limitations.

In the illustrated configuration, the switch is of the electronic drive type, i.e. it has a remote communication system between the switching part and the operating part, as described more clearly below.

However, according to an alternative not shown embodiment, the switch may also have a mechanical or electromechanical actuation with a key actuator.

Figure 1:
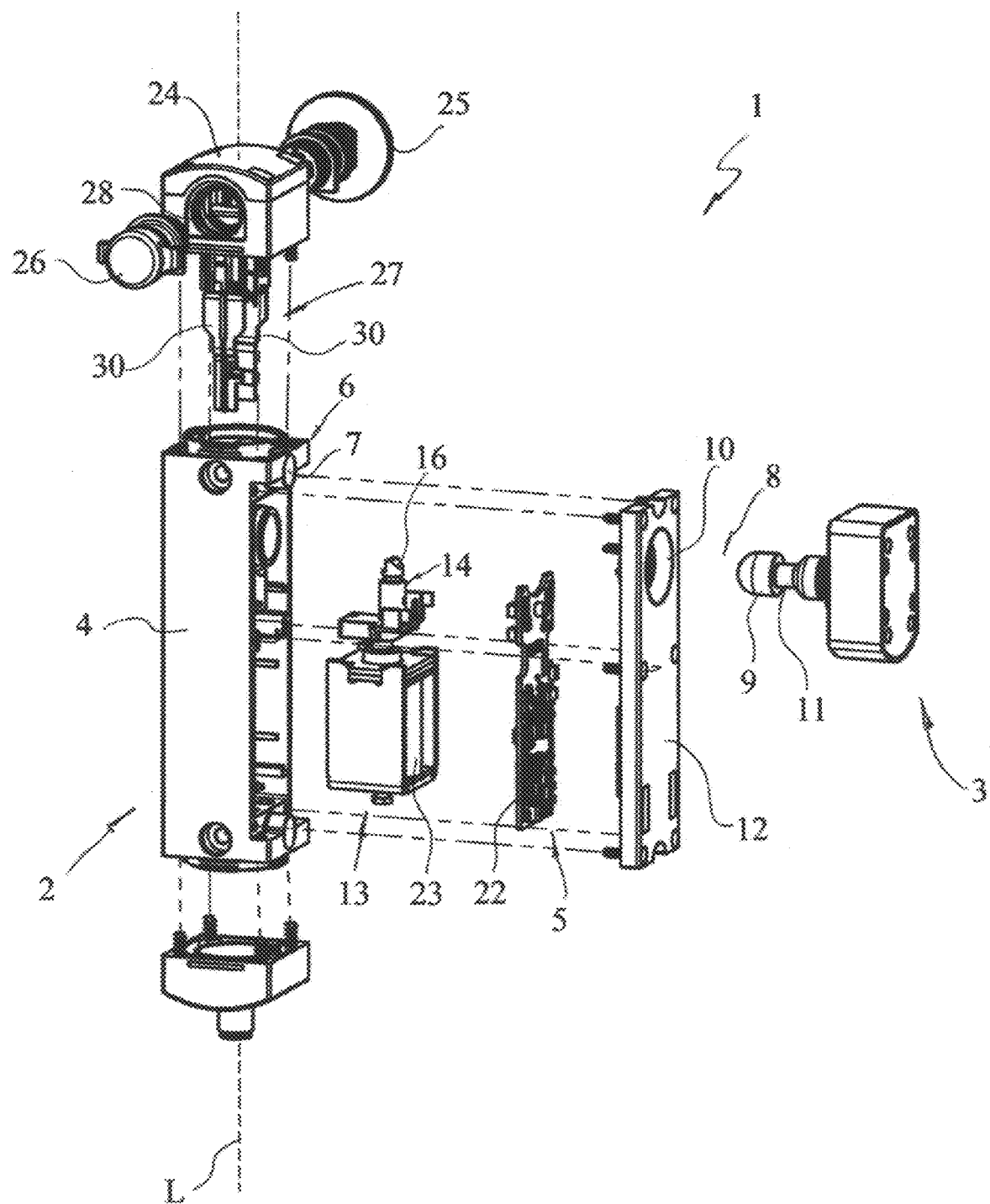
FIG. 1 is a first elevated exploded view of the switch of the invention.
Figure 2:
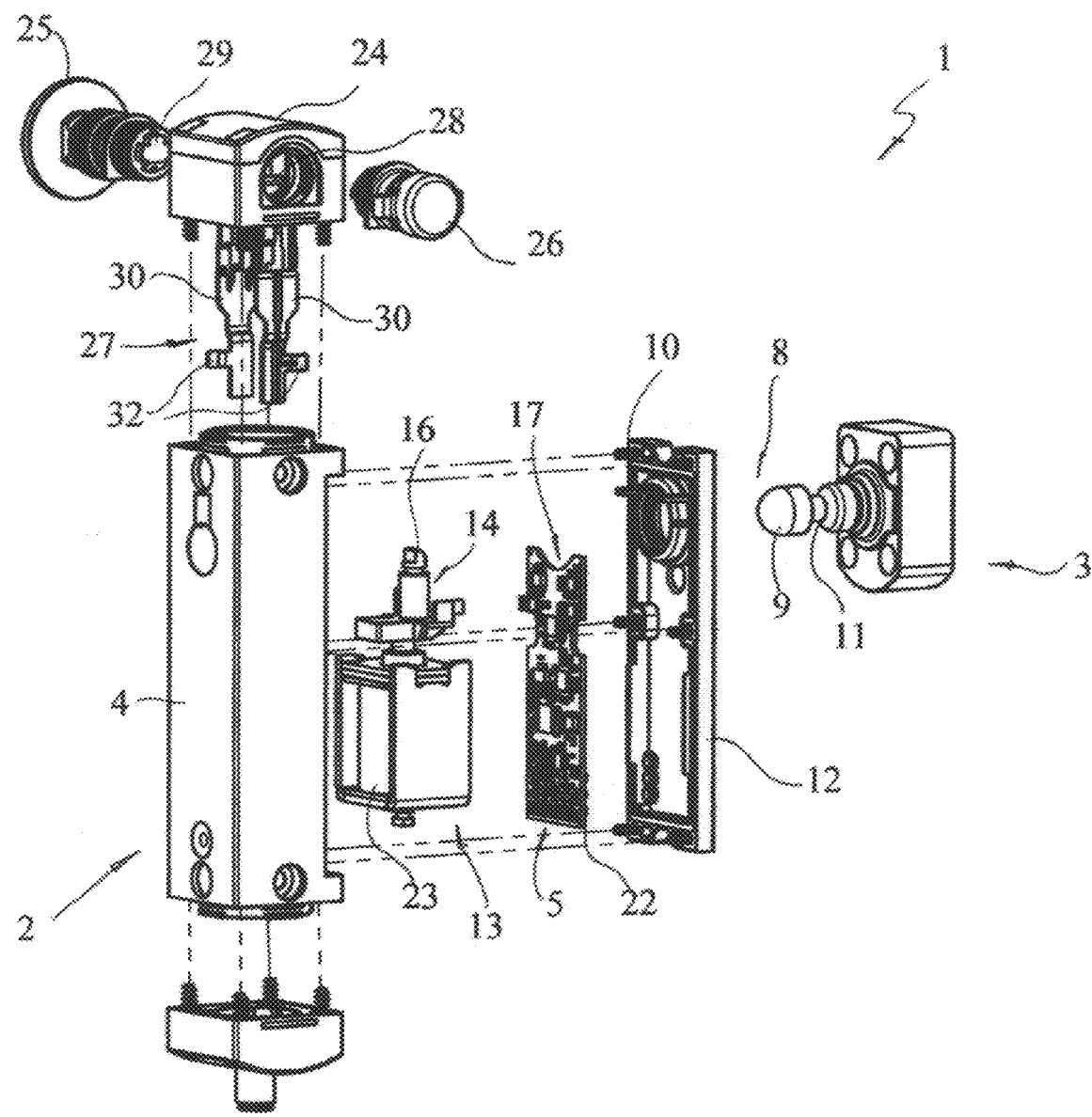
FIG. 2 is a second elevated exploded view of the switch of FIG. 1.

As can be seen from FIGS. 1 and 2, the switch, indicated globally with 1, comprises a switching device 2 adapted to be anchored to a fixed part of the access to be controlled and an operating device 3 adapted to be anchored to the movable part of the access.

The anchoring arrangements of the switching device 2 and of the operating device 3 to the respective access portions are of a known type and are not part of the present invention, so they will not be described in more detail below.

The switching device 2 comprises a casing 4 defining a longitudinal axis L and housing inside the switching means 5 adapted to be operatively connected to one or more electrical and/or electronic circuits for powering and/or controlling the main and/or service and emergency circuits, not shown.

The switching means 5 may be selected from those commonly used in the field and may also vary depending on the switch functionality without any particular limitations.

The means for connecting the switching means 5 will be selected from those typical for this type of product and they will not be described in more detail below, too.

Inside the casing 4 there are also actuator means 6 interacting with the switching means upon the opening/closing of the access for opening/closing one or more circuits of the machine or plant following the interaction between the switching device 2 and the operating device 3, also in this case according to known techniques.

The operating device 3 is designed to interact with the switching means 5 through the actuator means 6 following the opening or closing of the access to determine the opening or closing of one or more circuits in a typical mode of such safety switches.

The switch 1 shown in the figures is of the electronic drive type, i.e. the interaction between the operating device 3 and the switching means 5 will be controlled by an electronic signal transmitted to the switching means 5 by the operating device 3 when this latter is at a predetermined minimum distance from the switching device 2 such that it is possible to consider the access closed in a safe manner, as disclosed for example in the aforementioned WO2015083143.

In particular, the switching device 2 houses a receiver 7, such as an RFID antenna, inserted inside the casing 4 in a suitably provided seat and designed to receive a remote control signal, i.e. a presence signal, transmitted by a transmitter or transponder, not visible, housed in turn in the movable operating device 3, when the latter is at the minimum distance detectable by the switching device 2.

In particular, the transponder will be provided with a tag having an identification code that must be recognized by the receiver 7 in order to allow the machine or plant to start.

The code recognition can be unique or generic, depending on whether you want to achieve a high or low encoding level switch.

The switch 1 is also provided with centering means 8 for allowing at least partial recovery of the alignment between the receiver 7 and the transmitter or transponder in the event that the exact alignment between the parts or the exact alignment is lost during use.

The centering means 8 comprise a centering pin 9 transversely projecting from the operating device 3 and a centering hole 10 formed in front of the casing 4 and adapted to receive the centering pin 9 at the closing of the access.

Inside the centering hole 10 there may also be provided a retaining mechanism, not shown, suitable for engaging a corresponding groove 11 of the centering pin 9 and preventing it from escaping as a result of vibrations or accidental strokes on the access, causing unwanted openings.

In the illustrated configuration, the casing 4 is a monolithic body, possibly but not necessarily provided with the removable cover 12 for accessing thereinside.

However, according to a not shown variant, the casing 4 may also be modular and, for example, having a head which is anchored to the main body in a removable and/or rotatable manner and housing both the receiver 7 and the centering hole 10, as is always described in WO2015083143.

The centering pin 9 is designed to be inserted into the centering hole 10 to interact with an unlocking mechanism 13 connected to the switching means 5 and having a movable unlocking pin 14 adapted to translate longitudinally, at the opening of the access, with a predetermined maximum stroke from a locking position of the access to an unlocking position, leading to the opening of the switching means 5.

The unlocking pin 14 is associated with a lower slider 15 and has a shaped upper end 16 that in the locking position will project inside the centering hole 10 to engage the groove 11 of the centering pin 9 and lock the same for mechanical interference.

It is understood that the movement of the unlocking pin 14 will not necessarily be a simple translation but it may also be a composite movement such as a roto-translation movement.

The casing 4 also houses means 17 for detecting the stroke of the unlocking pin 14 which will be able to detect both the start of the stroke of the unlocking pin 14 and the arrival thereof at the end of the stroke.

In particular, the detection means 17 comprise at least one first detector 18 to detect the start of the stroke of the unlocking pin 14 and at least one second detector 19 to detect the end-stroke thereof.

The first detector 18 and the second detector 19 may be of any kind and preferably be of optical type, such as a photocoupler, optical barrier or the like, or a magnetic, inductive, capacitive or similar detector.

Suitably, the two detectors 18, 19 will be longitudinally offset with a distance lower than the maximum travel of the unlocking pin 14 so that the second detector 19 may intervene immediately before the unlocking pin 14 reaches the end-stroke position.

Preferably, the two detectors 18, 19 will be arranged at opposite sides of the unlocking pin 14. The lower slider 15 will in turn be integral with a pair of transverse arms 20, 21 also positioned at opposite sides of the unlocking pin 14 and longitudinally aligned with a corresponding detector 18, 19 to interact therewith upon the translation of the unlocking pin 14.

In particular, the transverse arms 20, 21 will be sized to cross the respective detector 18, 19 without interference.

The switching device 2 will also comprise a logic control unit 22 which, in addition to controlling the switching means 5, will also be adapted to manage communication with the operating device 3 and to transmit the signals.

In addition, the control logic unit 22 will also move the unlocking mechanism 13 as a result of interaction with the operating device 3.

In particular, in the illustrated configuration, the unlocking mechanism 13 comprises an electromagnet 23 which may be powered by the logic unit 22 following the opening of the access or when an emergency control is received to promote the downward movement of the slider 14.

Figure 3:
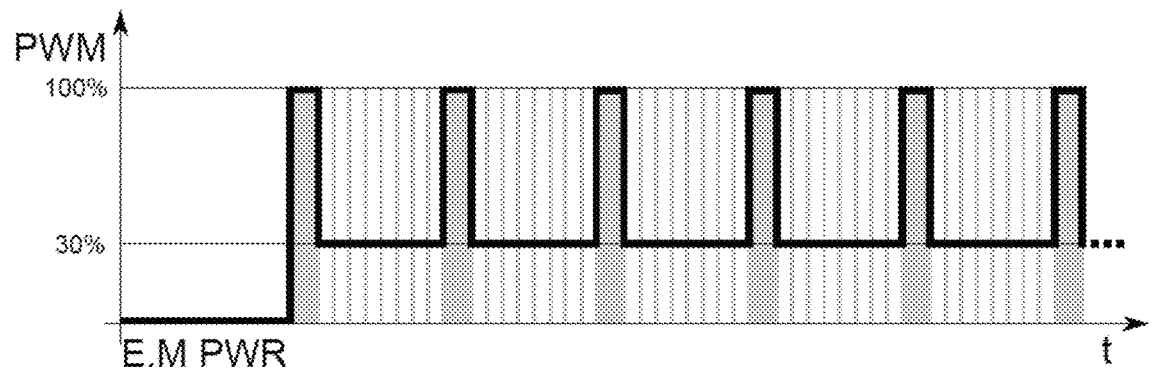
FIG. 3 shows a diagram of the powering of the electromagnet in a first operation mode.

FIG. 3 shows a first operating mode of the logic unit 22, substantially similar to what already happens in the switches according to known art.

According to this first operating mode, the logic unit 22, after detecting the access opening following the interruption of the communication between the receiver 7 and the transmitter, will begin to power the electromagnet with an impulsive energy, causing the lowering of the slider 15 and therefore of the unlocking pin 14 integral therewith.

The pulsed power will be hold both during the unlocking stroke of the unlocking pin 14 and during the permanence of the unlocking pin 14 in the end-stroke position.

Figure 4:
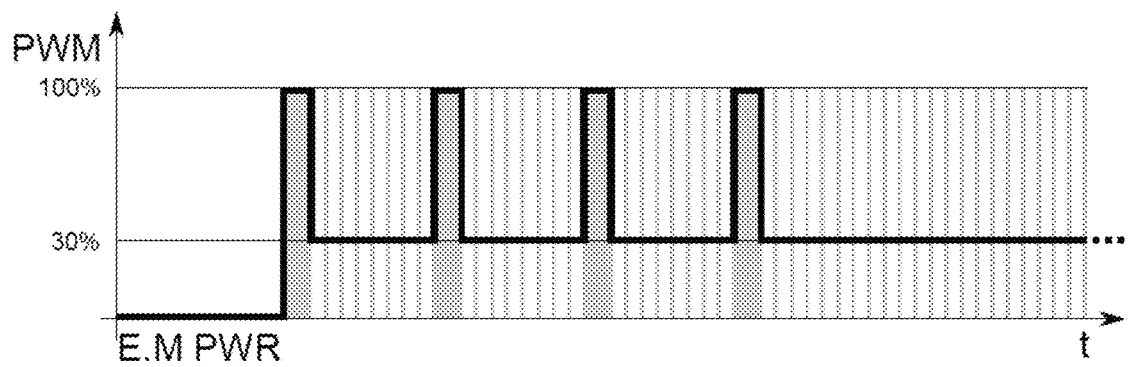
FIG. 4 shows a diagram of the powering of the electromagnet in a second operation mode.

FIG. 4 shows a novel and particularly advantageous alternative mode of operation that differs from the previous one, because the logic unit 22, following the reception of a signal from the second detector 19, indicating the presence of the unlocking pin 14 in the end-stroke position, will power the electromagnet 23 with an energy having a constant minimum value.

In an exemplary manner, the minimum power supply value may correspond to 30% of the pulse peak value.

The operation of the detection means 17 is more clearly illustrated in FIGS. from 5 to 7.

Figure 5:
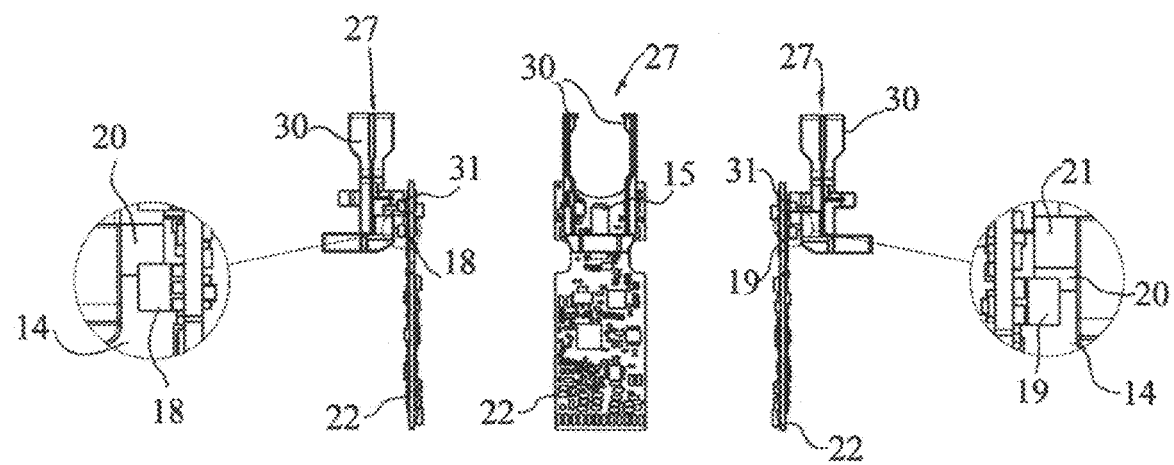
FIG. 5 is a first side view of the unlocking mechanism and of the detection means in a first operation condition.

In particular from FIG. 5 it is noted that at the beginning of the stroke of the slider 15 integral with the unlocking pin 14 one of the two transverse arms 20 will pass through the first detector 18 after a predetermined minimum initial stroke.

In the illustrated position there is still no detection by the first detector 18, which will occur when the arm 20 will be in a substantially complete manner within the first detector 18.

The second arm 21 will not interact with the second detector 19, as can be seen from the right image of FIG. 5.

Suitably, the logic unit 22 may be designed to open the switching means 5 after the only detecting by the first detector 18.

Figure 6:
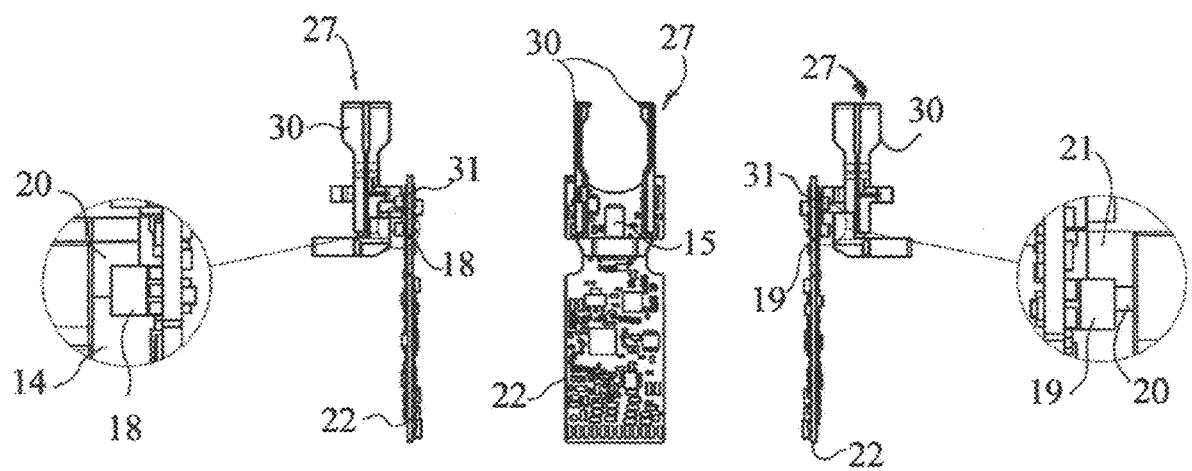
FIG. 6 is a second side view of the unlocking mechanism and of the detection means in a second operation condition.

Subsequently, as can be seen from FIG. 6, after an additional stroke, the second arm 21 also intercepts the second detector 19 producing information about that condition that may provide for the transmission of a visual signal such as the turning on of a control light directly on the casing 4 or at a central unit or external control panel.

Figure 7:
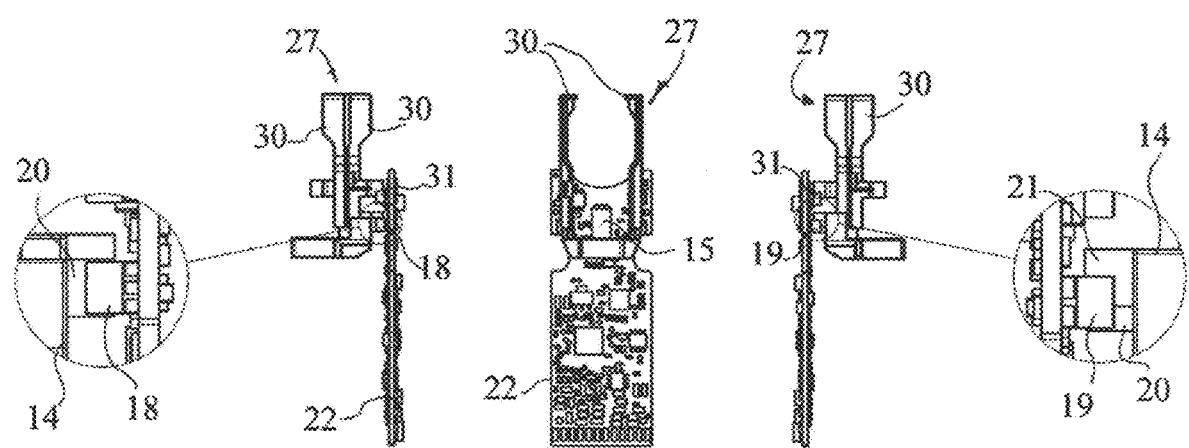
FIG. 7 is a front view of the unlocking mechanism and of the detection means in a third operation condition.

Finally, FIG. 7 shows the condition in which the slider 15 has reached the end-stroke. According to the preferred but not exclusive embodiment described hereinabove, the switching device 2 also comprises an auxiliary module 24 mounted on top of the casing 4, possibly in a removably and/or angularly adjustable manner, and provided with one or more auxiliary unlocking controls operatively connected to the unlocking mechanism 13 for forcing the sliding of the unlocking pin 14 toward the unlocking position even when the operating device 3 is inserted and the access is closed.

In the illustrated embodiment there are two different auxiliary controls, represented by an emergency button 25 and a key selector 26, which can be manually operated independently of one another in a known way.

Figure 8:
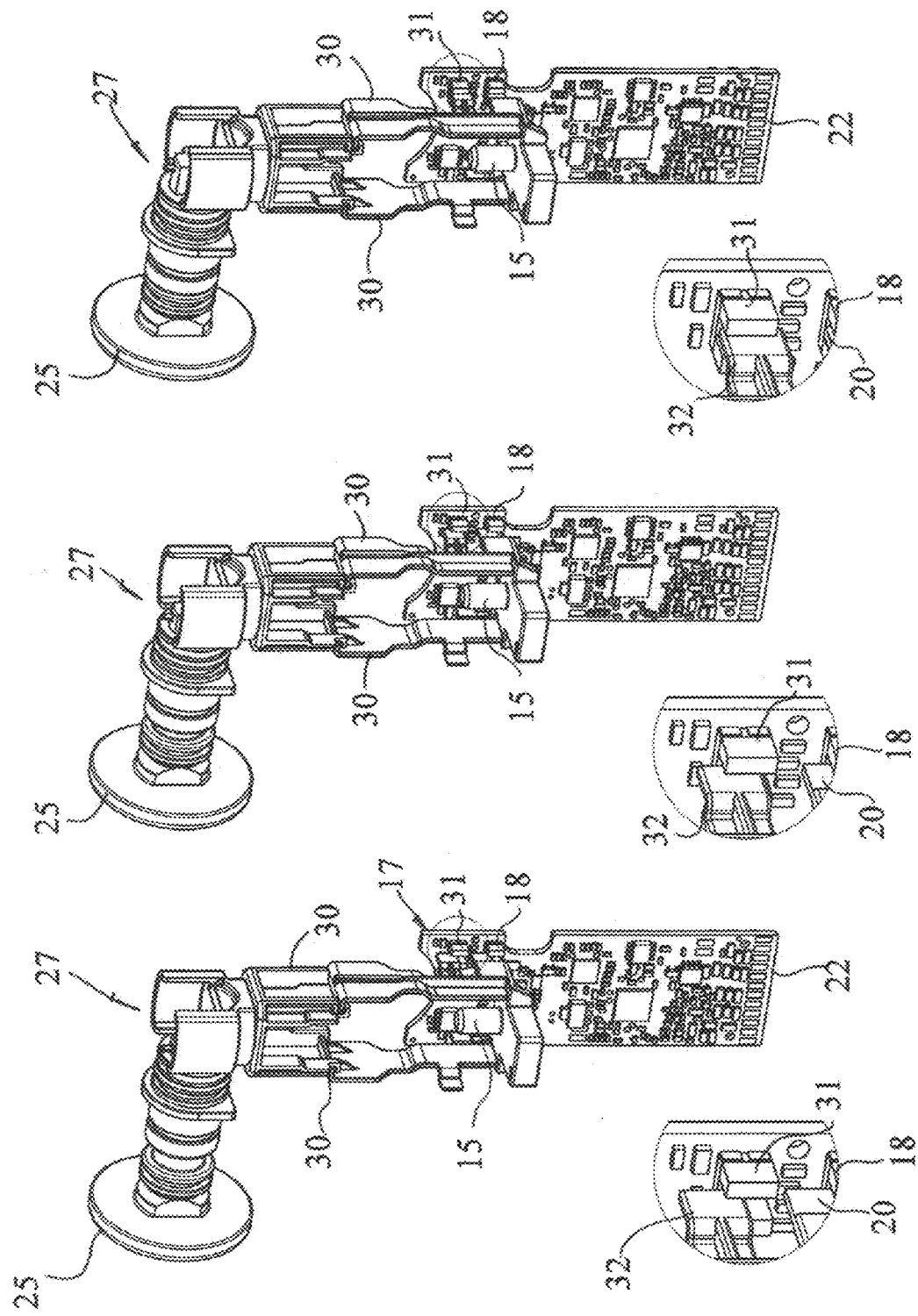
FIG. 8 is a perspective view of the unlocking mechanism and of the detection means during the driving sequence of an emergency pushbutton.

As more clearly shown in FIG. 8, the auxiliary controls 25, 26 are connected to the slider 15 through a rigid structure 27 movable longitudinally in the casing 4 as a result of the drive of one of the controls 25, 26 and of their passage from a rest position to an operative position in which the unlocking pin 14 is made to slide and the opening of the switching means 5 occurs. The movable structure 27 comprises at the upper end first inclined plane means 28 interacting with second inclined plane means 29 of complementary shape belonging to the emergency button 25 or to the selector 26 so that a transverse displacement of the emergency pushbutton 25 or rotation of the selector 26 corresponds to a longitudinal translation of the structure 27. The latter comprises a pair of second longitudinal arms 30, whose lower end will abut on the arms 20, 21 of the slider 15 when the unlocking pin 14 is in its starting position.

In this way, the drive of the auxiliary control 25, 26 will produce the corresponding downward movement of the unlocking pin 14 and the consequent opening of the power circuit.

Further, the detection means 17 will comprise a third detector 31 located upstream of the first two detectors 18, 19 with respect to the sliding direction of the unlocking pin 14 during the unlocking phase to detect the stroke of the movable structure 27.

In particular, one or both of the longitudinal arms 30 may comprise a projection 32 adapted to intercept a corresponding third detector 31 as a result of the downward stroke of the structure 27.

The detection by the third detector 31 will allow a suitable signal to be transmitted to the logic unit 22 to inform that the unlocking of the switch 1 has been caused by the drive of the auxiliary control 25, 26 and not by the opening of the access or by other causes.

From above it is apparent that the switch according to the invention achieves the intended objects and in particular to detect that unlocking was done by means of an auxiliary control.

The switch according to the invention is susceptible of numerous modifications and variations, all of which fall within the inventive concept expressed in the appended claims. All details may be replaced by other technically equivalent elements, and the materials may be different according to the needs without departing from the scope of the present invention.

Although the switch has been described with particular reference to the accompanying figures, the reference numbers used in the description and claims are used to improve the intelligence of the invention and do not constitute any limitation to the claimed scope.

The invention claimed is:

1. A safety switch with detection of a drive of an auxiliary unlocking control adapted to supervise a safety access of a machine or industrial plant, comprising:
a switching device (2) adapted to be associated to a fixed part of an access to be supervised and having a casing (4) defining a longitudinal axis (X) and housing switching means (5) adapted to be operatively connected to one or more control and/or service circuits for the control thereof;
an operating device (3) associated to a movable part of the access to interact with said switching means (5) at the time of opening/closing of the access for opening/closing one or more of said circuits;
an unlocking mechanism (13) housed in said casing (4) and having an unlocking pin (14) adapted to translate longitudinally with a maximum predetermined stroke from a locking position of the access to an unlocking position to operate the opening of said switching means (5);
means (17) for detection of the stroke of said unlocking pin (14) having at least one first detector (18) adapted to detect the start of the stroke of said unlocking pin (14);
at least one auxiliary unlocking control (25, 26) operatively connected to said unlocking mechanism (13) and susceptible to move from a rest position to an operative position of unlocking of the access and promote the translation of said unlocking pin (14) even with said actuator device (3) inserted;
characterized in that said detection means (17) comprise at least one auxiliary detector (31) adapted to detect the actuation of said at least one auxiliary unlocking control (25, 26).

2. Switch as claimed in claim 1, characterized in that said detection means (17) comprise at least one second detector (19) adapted to detect the end of the stroke of said unlocking pin (14).

3. Switch as claimed in claim 2, characterized in that said auxiliary detector (31) is located upstream of said first detector (18) and/or said second detector (19) with respect to the direction of translation of said unlocking pin (14) in the unlocking stroke of the access.

4. Switch as claimed in claim 1, characterized in that said at least one auxiliary unlocking control (25, 26) is operatively connected to said unlocking pin (14) through a rigid structure (27) longitudinally movable upon the operation of said auxiliary control (25, 26) and the passage thereof from said rest position to said operative position.

5. Switch as claimed in claim 1, characterized in that said unlocking pin (14) comprises a lower slider (15) integral with one or a pair of transverse arms (20, 21) adapted to interact with respective detectors (18, 19).

6. Switch as claimed in claim 5, characterized in that said movable structure (27) comprises one or more longitudinal arms (30) in abutment on corresponding transverse arms (21, 22) of said unlocking pin (14) when the latter is in said locked position to promote the translation towards said unlocking position in a substantially simultaneous manner with the operation of said auxiliary control (25, 26).

7. Switch as claimed in claim 1, characterized in that said detection means (17) are of the optical detection type, such as photocouplers, or light barriers, or magnetic, or inductive, or capacitive.

8. Switch as claimed in claim 2, characterized in that said first detector (18) and said second detector (19) are longitudinally offset with a distance less than the maximum stroke of said unlocking pin (14).

9. Switch as claimed in claim 1, characterized in that said switching device (2) comprises a logic control unit (22) adapted to operate said switching means (5) and said unlocking mechanism (13) following the interaction with said operating device (3).

10. Switch as claimed in claim 9, characterized in that said unlocking mechanism (13) comprises an electromagnet (23) powered from said logic unit (22) to promote the translation of said unlocking pin (14), said logic unit (22) being adapted to power said electromagnet (23) with energy pulses having a minimum value and a maximum value during the translation of said unlocking pin (14) and with a constant energy of minimum value when said unlocking pin (14) is in said unlocking position.

\* \* \* \* \*